United States Patent
Roy et al.

(10) Patent No.: US 6,573,133 B2
(45) Date of Patent: Jun. 3, 2003

(54) METHOD OF FORMING SPACERS IN CMOS DEVICES

(75) Inventors: Marc Roy, Granby (CA); Manon Daigle, Farnham (CA); Bruno Lessard, Granby (CA); Ginette Couture, Granby (CA)

(73) Assignee: Dalsa Semiconductor Inc., Waterloo (CA)

( * ) Notice: Subject to any disclaimer, the term of this patent is extended or adjusted under 35 U.S.C. 154(b) by 0 days.

(21) Appl. No.: 09/848,278

(22) Filed: May 4, 2001

(65) Prior Publication Data

US 2002/0020884 A1 Feb. 21, 2002

(30) Foreign Application Priority Data

May 4, 2000 (GB) ............................................. 0010650

(51) Int. Cl.[7] ......................................... H01L 21/8238
(52) U.S. Cl. ..................... 438/212; 438/231; 438/303; 438/199; 438/369; 438/268; 257/328
(58) Field of Search ................... 438/212, 233, 438/231, 303, 305, 592, 563, 595, 655, 266, 257, 199, 369

(56) References Cited

U.S. PATENT DOCUMENTS

| 5,087,582 | A | * | 2/1992 | Campbell et al. | ............ 438/231 |
| 5,188,704 | A | * | 2/1993 | Babie et al. | ................ 438/714 |
| 5,851,890 | A | | 12/1998 | Tsai et al. | .................... 438/303 |
| 5,989,966 | A | * | 11/1999 | Huang | ........................ 438/305 |
| 6,001,690 | A | | 12/1999 | Chien et al. | ................. 438/266 |
| 6,031,264 | A | * | 2/2000 | Chien et al. | ................. 257/315 |
| 6,033,963 | A | * | 3/2000 | Huang et al. | ............... 438/303 |
| 6,060,376 | A | * | 5/2000 | Gabriel et al. | ............. 438/585 |
| 6,204,136 | B1 | * | 3/2001 | Chan et al. | ................. 438/305 |
| 6,277,762 | B1 | * | 8/2001 | Hwang | ........................ 438/714 |
| 6,368,949 | B1 | * | 4/2002 | Chen et al. | ................. 438/592 |

FOREIGN PATENT DOCUMENTS

| EP | 0 899 792 A2 | 3/1999 | |
| EP | 0 991 114 A2 | 5/2000 | .......... H01L/21/28 |
| JP | 10-50660 | 2/1998 | |
| JP | 4010050660 | * | 2/1998 |

OTHER PUBLICATIONS

"Advanced ion implantation and rapid thermal annealing technologies for highly reliable 0.25μm dual gate CMOS", S. Shimizu et al., Symposium on VLSI Technology Digest of Technical Papers, 1996, pp. 64–65.

"Plasma etching of Si, SiO2, Si3N4, and resist fluorine, chlorine, and bromine compounds", Douglas R. Sparks, J. Electrochem. Soc., vol. 139, No. 6, Jun. 1992, pp. 1736–1741.

* cited by examiner

*Primary Examiner*—David Nelms
*Assistant Examiner*—Andy Huynh
(74) *Attorney, Agent, or Firm*—Marks & Clerk

(57) ABSTRACT

A sidewall spacer is formed in a CMOS device by depositing a layer of silicon nitride on a wafer and anisotropically etching away the silicon nitride layer with a chorine-based plasma etchant.

8 Claims, 1 Drawing Sheet

ND OF SPACERS IN CMOS
METHOD OF FORMING SPACERS IN CMOS DEVICES

BACKGROUND OF THE INVENTION

1. Field of the Invention

This invention relates a semiconductor fabrication technique, and in particular to a method of forming spacers in CMOS devices.

2. Description of the Prior Art

In the fabrication of CMOS devices, a polysilicon gate is typically deposited over a gate oxide grown on the silicon substrate. Ion implantation occurs through the field oxide located between the gates. In order to protect the gate region during the implantation step, the side walls of the gates are protected with vertical walls known as spacers. In the past, amorphous silicon was used for the spacers, but this created problems during subsequent etching in that it was difficult to avoid over-etching and the removal of part of the underlying layer. Over-etching occurs when etching extends into the underlying layer. Often when the spacers were removed, a polysilicon gate would be etched at the same time leaving a notch, known as a "mouse bite" in the polysilicon gate.

An object of the invention is to alleviate this problem.

SUMMARY OF THE INVENTION

In accordance with one aspect of the present invention, the side wall spacers are made of silicon nitride. Silicon nitride has the advantage of offering good selectivity, making it easy to avoid over-etching when the precursor conformal layer is removed.

In accordance with an important aspect of the invention, a conformal silicon nitride layer is etched using a chlorine-based plasma etch chemistry. Such etch chemistry consists of chlorine ($Cl_2$), hydrogen bromide ($HB_r$), and a mixture of helium and oxygen. This is in contrast to the conventional $CHF_3$ chemistry, which is normally used for silicon nitride etching. The applicants have found that using conventional silicon nitride etch chemistry, it is very difficult to avoid over-etching into the gate oxide because of the high plasma power and the limited oxide/nitride selectivity of 1.8 to 1.

In accordance with the present invention, it has been found surprisingly that oxide/nitride selectivities in the order of 3 to 1 can be achieved, which completely protects the gate oxide. In the invention the etching is caused largely by chemical rather than the mechanical interaction associated with $CHF_3$ plasmas. The Cl_ radicals etch the silicon nitride chemically and the HBr component is responsible mainly for mechanical etching by the plasma. The reaction of HBr with silicon nitride also creates a protective polymer layer that protects the more vertical profiles of the etched films, resulting in a more anisoptropic etch. Some spacers are left along the polysilicon lines with a rounded shape.

While the etch rate using chlorine-based etch chemistry, typically around 2000 Angstroms per minute, is somewhat slower than $CHF_3$—based chemistry, typically around 5000 Angstroms per minute, this trade-off is more than offset by the improvement in selectivity obtainable.

The conformal nitride layer is preferably deposited onto a thin oxide layer, typically about 200 Angstroms thick.

BRIEF DESCRIPTION OF THE DRAWINGS

The invention will now be described in more detail, by way of example only, with reference to the accompanying drawings in which.

DETAILED DESCRIPTION OF THE PREFERRED EMBODIMENTS

Figure 1:
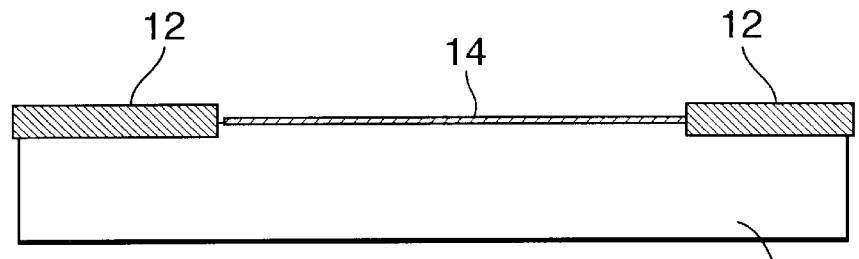
FIGS. 1 to 4 show successive steps in the manufacture of a CMOS device in accordance with the principles of the present invention.

Referring now to the drawings, the CMOS device comprises a silicon substrate 10. First, as shown in FIG. 1, a silicone nitride layer (not shown) is deposited on the substrate and then patterned to leave regions of exposed silicon. The wafer is then exposed to an oxidizing atmosphere to grow field oxide layer 12 in a conventional manner. After removal of the nitride layer, gate oxide 14 is grown between the field oxide regions 12.

Figure 2:
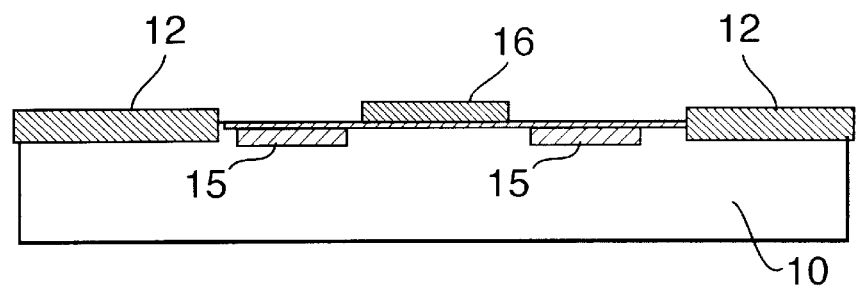

After growing the gate oxide 14, a polysilicon layer is grown and subsequently patterned to form polysilicon gates 16 on gate oxide 14 (FIG. 2).

Typically, after the patterning of the polysilicon gate 16, a first ion implantation takes place to form source and drain active regions 15.

Figure 3:
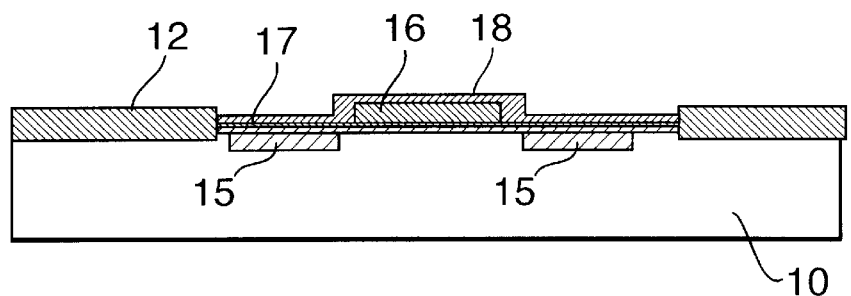
Figure 4:
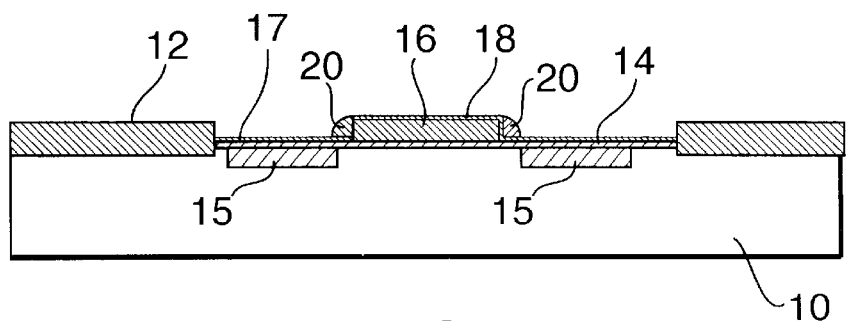

Next, an oxidation step takes place (FIG. 3) to grow a thin silicon oxide layer 17, which is typically about 200 Angstroms thick.

In the next step, a conformal silicon nitride layer 18 is deposited over the surface of the wafer using LPCDV (Low Pressure Chemical Vapor Deposition). The objective is to remove the silicon nitride layer 18 except for the vertical side wall portions 20 protecting the polysilicon gates 16 by etching down to the thin oxide layer 17. The remaining side wall portions 20 forming the spacers slightly rounded as shown. The removal of the horizontal portions of the silicon nitride layer without effecting the underlying layers requires good nitride/oxide selectivity and also good anisotropy to avoid lateral etching into the side walls 20.

In accordance with the principles of the invention, the anisotropic etch is performed using an etch recipe comprising chlorine ($Cl_2$), hydrogen bromide ($HB_r$) and a mixture of helium and oxygen. The etch is performed as an reactive ion etch using a magnetic field to ensure good uniformity on the wafer. The preferred etch variables are set out in the following table:

| Step | Main Etch | Over Etch |
| --- | --- | --- |
| Pressure | 150 mTorr | 100 mTorr |
| Power | 325 Watts | 150 Watts |
| Magnetic field | 75 Gauss | 75 Gauss |
| HBr flow | 10 Sccm | 10 Sccm |
| $Cl_2$ flow | 30 Sccm | 15 Sccm |
| $He/O_2$ flow | 0 Sccm | 10 Sccm |
| Nitride Etch rate | 2063 Å/min. | 480 Å/min. |
| Nitride Etch uniformity | 0.96% | 11.3% |
| Oxide Etch rate | 680 Å/min. | 30 Å/min. |
| Oxide Etch uniformity | 3.7% | 23.0% |
| Nitride to Oxide | 3:1 | 16.5:1 |

The etch is formed in two steps: the main etch and the over-etch. It will be noted that in the main etch, nitride/oxide selectivities of 3 to 1 are achieved, and in the over-tech, to remove any remaining nitride layer, selectivities as high as 16.5 to 1 are achieved.

The etch endpoint is detected using optical methods by detecting the chlorine spectral line at 4705 Å. At this point, the chlorine stops being consumed, so by looking at the chlorine spectral line at 470.5 nm, it is possible to determine when the silicon nitride has been completely etched.

Finally, a second polysilicon layer is deposited over the wafer and selectively etched so that the second layer lies over the polysilicon gates 18.

Next ion implantation is carried out through the thin oxide layer to form active components, such as transistors. Typically, N+ and P+ species are implanted, and in accordance with the principles of the invention, these are implanted directly through the thin oxide layer 17, which is left in situ.

The use of silicon nitride spacers has several advantages. It gives more flexibility in the etching techniques that can be used for the adjacent films. It permits good control of conformability to the wafer surface, and the good selectivity permits the avoidance of over-etching of the underlying layer.

This is important because the silicon nitride layer is about 3,000–4,000 Å thick.

It is indeed surprising, but highly significant, that the use of an etch recipe typically applied to polysilicon improves the selectivity and anisotropy of a silicon nitride etch, a fact that leads to a major improvement in the fabrication of CMOS devices.

We claim:

1. A method of forming a sidewall spacer in a CMOS device, comprising depositing a layer of silicon nitride on a wafer, and anisotropically etching away lateral portions of said silicon nitride layer to leave said sidewall spacer by performing a reactive ion etch in the presence of a magnetic field with an etchant comprising at least a mixture of chlorine and hydrogen bromide, and wherein said etch is performed in two steps, namely a main etch to remove the major portion of said silicon nitride layer, and an over-etch at reduced pressure and power to remove any residual silicon nitride layer.

2. The method as claimed in claim 1, wherein a thin silicon oxide layer is formed prior to the deposition of said silicon nitride layer, and said lateral portions of said silicon nitride are etched away down to said thin oxide layer.

3. The method as claimed in claim 2, wherein said etchant in said over-etch step also comprises a mixture of helium and oxygen.

4. The method as claimed in claim 3, wherein the main etch and over etch have the following parameters.

| Step | Main Etch | Over Etch |
| --- | --- | --- |
| Pressure | 150 mTorr | 100 mTorr |
| Power | 325 Watts | 150 Watts |
| Magnetic field | 75 Gauss | 75 Gauss |
| HBr flow | 10 Sccm | 10 Sccm |
| $Cl_2$ flow | 30 Sccm | 15 Sccm |
| $He/O_2$ flow | 0 Sccm | 10 Sccm |
| Nitride Etch rate | 2063 Å/min. | 480 Å/min. |
| Nitride Etch uniformity | 0.96% | 11.3% |
| Oxide Etch rate | 680 Å/min. | 30 Å/min. |
| Oxide Etch uniformity | 3.7% | 23.0% |
| Nitride to Oxide Selectivity | 3:1 | 16.5:1 |

5. The method as claimed in claim 2, further comprising the step of implanting impurities through said thin oxide layer to form active components in said wafer.

6. The method as claimed in claim 5, wherein said impurities are selected from the group consisting of $N^+$ and $P^+$ species.

7. The method as claimed in claim 5, wherein said active components are transistors.

8. A method of forming a sidewall spacer in a CMOS device, comprising depositing a layer of silicon nitride on a wafer, and anisotropically etching away lateral portions of said silicon nitride layer to leave said sidewall spacer by performing a reactive ion etch in the presence of a magnetic field with an etchant comprising at least a mixture of chlorine and hydrogen bromide, and wherein said etch is performed in two steps, namely a main etch, and an over-etch at reduced pressure and power to remove any residual silicon nitride layer, and wherein said etchant in said over-etch step includes helium and oxygen.

* * * * *